United States Patent [19]

Kusaba

[11] Patent Number: 5,412,607
[45] Date of Patent: May 2, 1995

[54] SEMICONDUCTOR MEMORY DEVICE

[75] Inventor: Susumu Kusaba, Tokyo, Japan

[73] Assignee: Oki Electric Industry Co., Ltd., Tokyo, Japan

[21] Appl. No.: 248,880

[22] Filed: May 25, 1994

[30] Foreign Application Priority Data

May 28, 1993 [JP] Japan .................................. 5-127566

[51] Int. Cl.$^6$ .............................................. G11C 11/40
[52] U.S. Cl. ..................... 365/208; 365/205; 327/51
[58] Field of Search ................. 365/205, 208; 307/530

[56] References Cited

U.S. PATENT DOCUMENTS

| 5,111,429 | 5/1992 | Whitaker | 365/208 X |
| 5,325,335 | 6/1994 | Ang et al. | 365/208 X |
| 5,353,249 | 10/1994 | Itano | 365/208 X |
| 5,353,255 | 10/1994 | Komuro | 365/208 |

OTHER PUBLICATIONS

Katsuro Sasaki et al., "A 7-ns 140-mW CMOS SRAM with Current Sense Amplifier", *IEEE Journal of Solid-State Circuits*, vol. 27, No. 11, Nov. 1992, pp. 1511-1517.

*Primary Examiner*—Do Hyun Yoo
*Attorney, Agent, or Firm*—Spencer, Frank & Schneider

[57] ABSTRACT

A semiconductor memory device according to the present invention includes a first and second bit lines; a word line; a memory cell electrically connected to the first and second bit lines and the word line; a first current sense amplifier for reducing a potential level of a current flowing in the first and second bit lines and including diode-connected first and second P-type transistors, third and fourth N-type transistors series-connected to the first and second P-type transistors respectively and a fifth N-type transistor connected to the third and fourth N-type transistors, the first P-type transistor having a control electrode electrically connected to a control electrode of the fourth N-type transistor and the second P-type transistor having a control electrode electrically connected to a control electrode of the third N-type transistor; and a second sense amplifier electrically connected to an output of the first current sense amplifier, for amplifying the amplitude of a potential applied between the first and second bit lines.

4 Claims, 3 Drawing Sheets

SEMICONDUCTOR MEMORY DEVICE

TECHNICAL FIELD

This invention relates to arrangements of sense amplifiers suitable for use in a semiconductor memory device.

BACKGROUND ART

Each of sense amplifiers employed in a semiconductor memory device is of a kind of an amplifying circuit for sensing a microsignal. As typical sense amplifiers, there are known those such as a bit line sense amplifier and an I/O sense amplifier. The bit line sense amplifier is used to sense a microsignal on a bit line pair, which is produced from a memory cell, whereas the I/O sense amplifier is used to sense a signal transmitted over a data bus line pair and amplify it.

As these sense amplifiers, there are known those of current and voltage types. A current type sense amplifier related to this invention has been disclosed in a reference 1 (A7-ns 140-mW 1-Mb CMOS SRAM with Current Sense Amplifier, IEEE JOURNAL OF SOLID-STATE CIRCUITS, VOL. 27, NO. 11, NOVEMBER 1992, pp. 1511 through 1518), for example. This type of current sense amplifier is used to amplify the amplitude of current flowing in each bit line depending on a difference between currents which flow in the bit line pair, and is particularly effective when it is activated at a low voltage and its amplitude is small.

DISCLOSURE OF THE INVENTION

It is an object of the present invention to provide a semiconductor memory device capable of obtaining a high gain and providing low current consumption and high integration.

According to one aspect of the present invention, for achieving the above object, there is provided a semiconductor memory device comprising a first and second bit lines; a word line; a memory cell electrically connected to the first and second bit lines and the word line; a first current sense amplifier for reducing a potential level of a current flowing in the first and second bit lines and comprising diode-connected first and second P-type transistors, third and fourth N-type transistors series-connected to the first and second P-type transistors respectively and a fifth N-type transistor connected to the third and fourth N-type transistors, the first P-type transistor having a control electrode electrically connected to a control electrode of the fourth N-type transistor and the second P-type transistor having a control electrode electrically connected to a control electrode of the third N-type transistor; and a second sense amplifier electrically connected to an output of the first current sense amplifier, for amplifying the amplitude of a potential applied between the first and second bit lines.

BEST MODE FOR CARRYING OUT THE INVENTION

Figure 1:
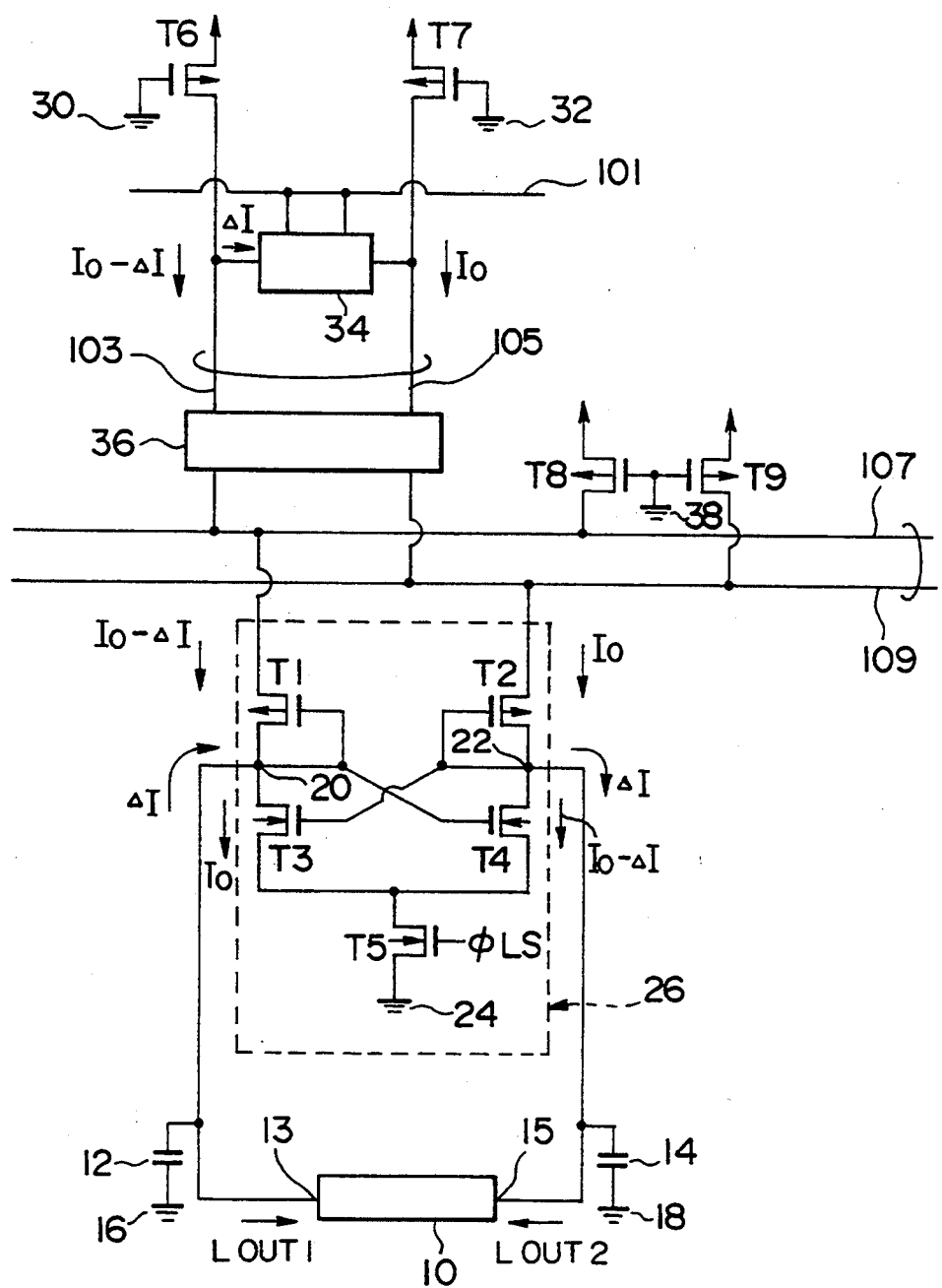
FIG. 1 is a circuit diagram for describing the structure of a semiconductor memory device of the present invention.

FIG. 1 is a circuit diagram for describing the structure of a semiconductor memory device of this invention.

The semiconductor memory device of the present invention comprises a first pull-up P-type MOS transistor (hereinafter abbreviated as a "first transistor") T6, a second pull-up P-type MOS transistor (hereinafter abbreviated as a "second transistor") T7, a first bit line (hereinafter abbreviated as a "BL") 103, a second bit line (hereinafter abbreviated as a "$\overline{BL}$") 105, a word line (hereinafter abbreviated as a "WL") 101, a memory cell 34, a column switch 36, a data line (hereinafter abbreviated as a "DL") 107, a data line (hereinafter abbreviated as a "$\overline{DL}$") 109, a first sense amplifier 26 and a second sense amplifier 10.

Each of the first and second transistors T6 and T7 has a first main electrode, a second main electrode and a control electrode. The first main electrode of the first transistor T6 is electrically connected to a power supply (Vcc) and the second main electrode of the first transistor T6 is electrically connected to the BL103. Further, the control electrode of the first transistor T6 is electrically connected to an earth 30.

The first main electrode of the second transistor T7 is electrically connected to the power supply (Vcc) and the second main electrode of the second transistor T7 is electrically connected to the $\overline{BL}$ 105. Further, the control electrode of the second transistor T7 is electrically connected to an earth 32.

The memory cell 34 is electrically connected between the BL 103 and the $\overline{BL}$ 105 and electrically connected to the WL 101. An input of the column switch 36 is electrically connected to the BL103 and $\overline{BL}$ 105. An output of the column switch 36 is electrically connected to the DL 107 and the $\overline{DL}$ 109. An input of the first sense amplifier is electrically connected to the DL107 and the $\overline{DL}$ 109. An output of the first sense amplifier 26 is electrically connected to the second sense amplifier 10.

A first parasitic capacitance 12 and a second parasitic capacitance 14 are respectively electrically connected to a first and second nodes 20 and 22 provided within the first sense amplifier 26 when the semiconductor memory device of the present invention is activated.

The memory cell 34 is of a static type memory device. As this type of memory cell 34, there is known one which has been described in, e.g., a reference 2 (entitled "Introduction to VLSI technology" published by Heibonsha Limited, Publishers in Sep. 1, 1986, pp. 34 and 35).

Figure 2:
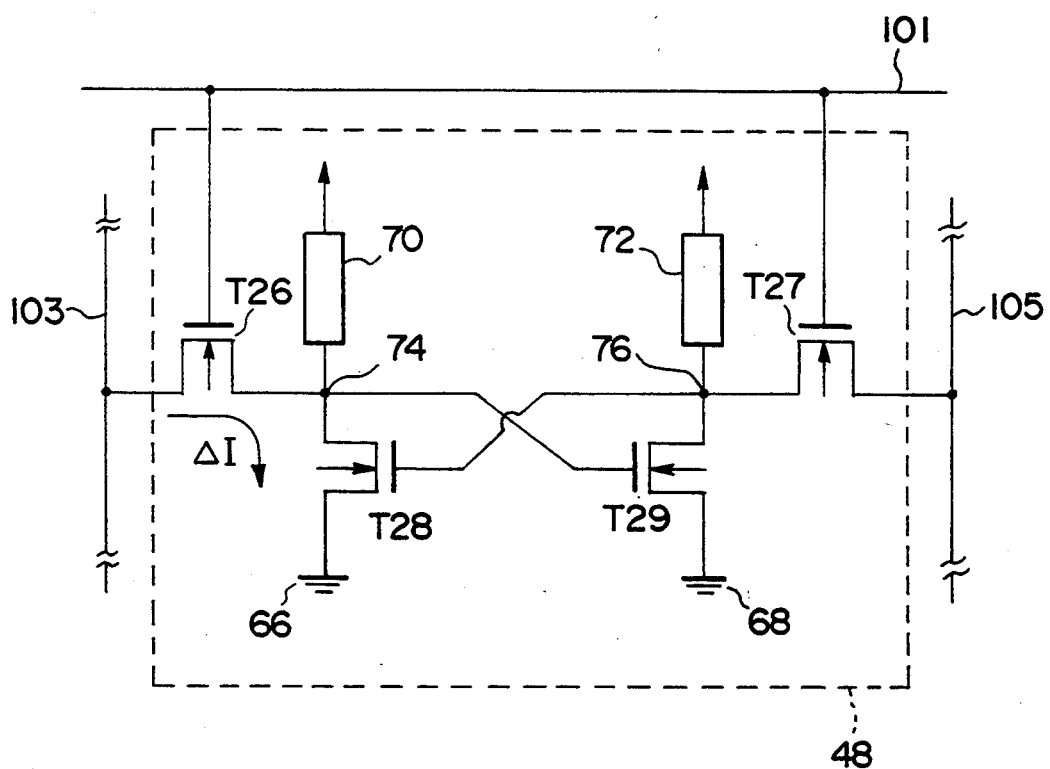
FIG. 2 is a circuit diagram for describing the structure of a memory cell employed in the semiconductor memory device of the present invention.

The configuration of the memory cell 34 will now be described with reference to FIG. 2.

The memory cell 34 comprises a first transfer N-type MOS transistor (hereinafter abbreviated as a "third transistor") T26, a second transfer N-type MOS transistor (hereinafter abbreviated as a "fourth transistor") T27, a first drive N-type MOS transistor (hereinafter abbreviated as a "fifth transistor") T28, a second drive N-type MOS transistor (hereinafter abbreviated as a "sixth transistor") T29, and load elements 70 and 72. Each of the third through sixth transistors T26, T27, T28 and T29 has a first and second main electrodes and a control electrode.

Electrical connections between the respective components which form the memory cell 34 are as follows:

The control electrode of the third transistor T26 is electrically connected to the WL101 and the first main electrode of the third transistor T26 is electrically connected to the BL103. The control electrode of the fourth transistor T27 is electrically connected to the WL101 and the first main electrode of the fourth transistor T27 is electrically connected to the $\overline{BL}$ 105. The second main electrode of the fifth transistor T28 is electrically connected to the load element 70 and the second main electrode of the third transistor T26 through a third node 74. The second main electrode of the sixth transistor T29 is electrically connected to the load element 72 and the second main electrode of the fourth transistor T27 through a fourth node 76. The load elements 70 and 72 are electrically connected to the power supply (Vcc). The second main electrode of the third transistor T26 and the control electrode of the sixth transistor T29 are electrically connected to each other through the third node 74. The second main electrode of the fourth transistor T27 is electrically connected to the control electrode of the fifth transistor T28 through the fourth node 76. The first main electrodes of the fifth and sixth transistors T28 and T29 are electrically connected to earths 66 and 68 respectively.

The memory cell 34 having the above configuration is electrically connected to the column switch 36 for selecting a column through the bit lines BL103 and $\overline{BL}$ 105. The column switch 36 is electrically connected to the DL107 and the $\overline{DL}$ 109.

The first sense amplifier 26 comprises a P-type transistor (hereinafter abbreviated as a "seventh transistor") T1, a P-type transistor (hereinafter abbreviated as an "eighth transistor") T2, an N-type transistor (hereinafter abbreviated as a "ninth transistor") T3, an N-type transistor (hereinafter abbreviated as a "tenth transistor") T4 and an N-type transistor (hereinafter abbreviated as an "eleventh transistor") T5. Each of the seventh through eleventh transistors has a first and second main electrodes and a control electrode.

Electrical connections between the respective components which form the first sense amplifier 26 are as follows:

The first main electrode of the seventh transistor T1 is electrically connected to the column switch 36 through the DL107. The second main electrode of the seventh transistor T1 is electrically connected to the second main electrode of the ninth transistor T3 through the first node 20. The control electrode of the seventh transistor T1 is electrically connected to the first node 20.

The first main electrode of the eighth transistor T2 is electrically connected to the column switch 36 through the $\overline{DL}$ 109. The second main electrode of the eighth transistor T2 is electrically connected to the second main electrode of the tenth transistor T4 through the second node 22. The control electrode of the eighth transistor T2 is electrically connected to the second node 22.

The control electrode of the seventh transistor T1 is electrically connected to the control electrode of the tenth transistor T4. The control electrode of the eighth transistor T2 is electrically connected to the control electrode of the ninth transistor T3.

The first main electrodes of the ninth and tenth transistors T3 and T4 are respectively electrically connected to the second main electrode of the eleventh transistor T5 through a common line. The first main electrode of the eleventh transistor T5 is electrically connected to an earth 24.

One end of the first parasitic capacitance 12 is electrically connected to the first node 20 and one end of the second parasitic capacitance 14 is electrically connected to the second node 22. The other ends of the first and second parasitic capacitances 12 and 14 are electrically connected to earths 16 and 18 respectively. Here, the first and second parasitic capacitances 12 and 14 are produced when the semiconductor memory device of the present invention is activated.

The first and second nodes 20 and 22 are respectively electrically connected to a fifth and sixth nodes 13 and 15 of the second sense amplifier 10.

Since the seventh and eighth transistors T1 and T2 are diode-connected to each other, the first sense amplifier 26 can be activated at a saturation region. Further, since the control electrodes of the seventh and eighth transistors T1 and T2 are cross-connected to the control electrodes of the ninth and tenth transistors T3 and T4, the first sense amplifier 26 can obtain a high gain.

As a sense amplifier corresponding to a first stage, which is employed in a normal static semiconductor memory device, is used one of a current mirror type as has been described in the reference 1 disclosed in the paragraph of "BACKGROUND ART". Now consider the case where the first sense amplifier of the invention of the present application, which corresponds to a first stage, is compared with the current mirror type sense amplifier. Since the first sense amplifier is constructed in the above-described manner, each of the P-type transistors in the first sense amplifier can ensure a saturation region without using a bias circuit. Further, since each of the P-type transistors is activated so as to amplify the amplitude of a difference between currents flowing in the P-type transistors, it can obtain a high gain. Since the bias circuit is unnecessary, low current consumption and high integration can be achieved.

Operation of the semiconductor memory device of the present invention will next be described with reference to FIGS. 1 and 3.

When a potential of a Vss level is applied to the WL101, the third and fourth transistors T26 and T27 in the memory cell 34 are brought into an OFF state. Thus, a current I0 supplied from the power supply (Vcc) flows in the BL103 and the $\overline{BL}$ 105 through the first and second transistors T6 and T7. When the BL103 and the $\overline{BL}$ 105 are selected by the column switch 36 at this time, the current $I_0$ similar to that flowing in the bit line pair BL103 and $\overline{BL}$ 105 flows in the DL107 and the $\overline{DL}$ 109. Although a slight current is supplied to the DL107 and the $\overline{DL}$ 109 by the pull-up P-type transistors T8 and T9 in the present embodiment, this current will be neglected to provide an easy description. Let's also consider that a control signal $\phi$LS supplied to the control electrode of the eleventh transistor T5 of the first sense amplifier 26 is maintained at the potential of the Vcc level and the first sense amplifier 26 is in an enable state. In this condition, the current $I_0$ flows in each of the seventh and eighth transistors T1 and T2. Further, the same current I0 flows in each of the ninth and tenth transistors T3 and T4.

Next, when the potential supplied to the WL101 changes from the Vss level to the Vcc level, the third and fourth transistors T26 and T27 in the memory cell 34 are brought into an ON state, so that the current I0 supplied from the power supply (Vcc) flows into the BL103 and the $\overline{BL}$ 105 through the first and second transistors T6 and T7. At this time, a slight current ΔI passes through the third node 74 and the fifth transistor T28 so as to flow from the BL103 to an earth 66. Thus, a current I₀ΔI flows into the BL103 between the memory cell 34 and the column switch 36 and the current I₀ flows into the $\overline{BL}$ 105.

The current I₀ΔI flows into the seventh transistor T1 through the DL107. Further, the current 10 flows into the eighth transistor T2 through the $\overline{DL}$ 109.

When the ninth and tenth transistors T3 and T4 are now set so as to be normally activated at the saturation region, a current $I_D$, which flows into each of the ninth and tenth transistors T3 and T4, is proportional to the square of a value obtained by subtracting a threshold voltage $V_{TH}$ from a gate-to-source voltage $V_{GS}$ of each transistor. This relationship is represented as the following equation:

$$I_D = k(V_{GS} - V_{TH})^2$$

where K represents a proportional constant.

The following potential level shift occurs based on the above equation.

When the potential supplied to the WL101 changes from the Vss level to the Vcc level, the potential at the second node 22 is brought to the same potential as that obtained when the potential supplied to the WL101 is of the Vss level because the current 10 is flowing in the eighth transistor T2. Thus, the current, which flows in the ninth transistor T3, remains at I₀. On the other hand, the potential at the first node 20 is reduced by a potential corresponding to ΔV since the potential at the BL103 is brought to the potential of the Vcc level of the WL. Accordingly, the current, which flows in the tenth transistor T4 is brought to I₀Δl.

A voltage characteristic obtained by measuring a variation in potential between the pair of bit lines and a variation in potential applied to each of the first and second nodes when the potential of the Vcc level is applied to the WL, will next be described with reference to FIG. 3. In FIG. 3, the axis of ordinates represents a potential level and the axis of abscissas represents a time interval.

Figure 3:
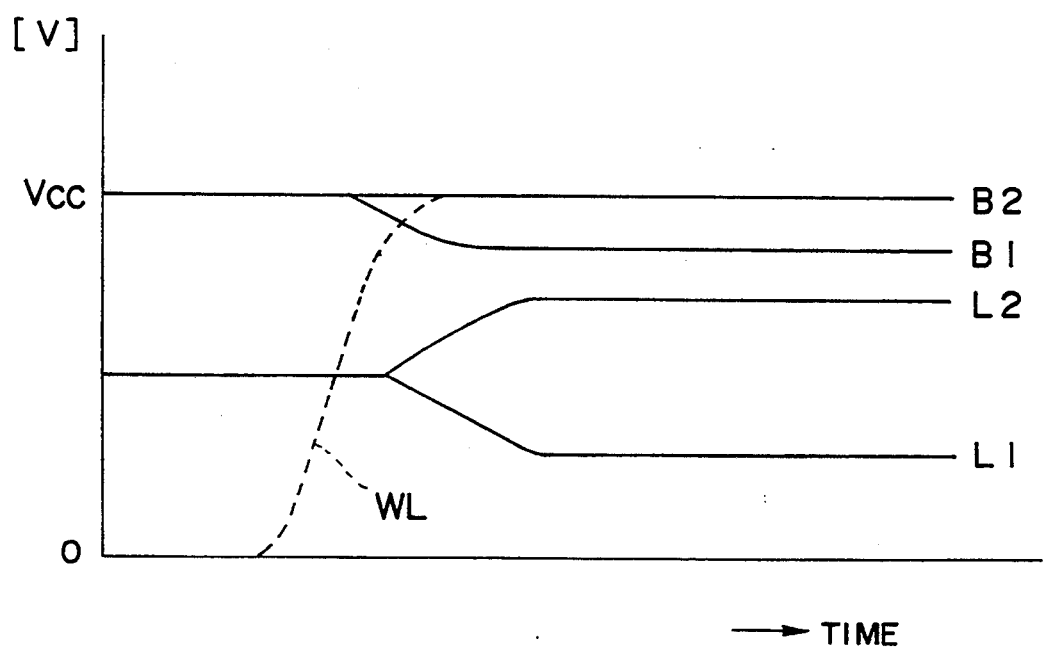
FIG. 3 is a diagram for describing the operation of the semiconductor memory device of the present invention.

Referring to FIG. 3, when the potential of the Vcc level is applied to the WL, a potential level (B1) at the $\overline{BL}$ 105 does not vary but a potential level (B2) at the BL103 is reduced.

On the other hand, the potential at the second node 22 is brought to a potential of a level L2 owing to the charging of the second parasitic capacitance 14. Further, the potential at the first node 20 is reduced to a potential of a level L1 owing to the discharging of the first parasitic capacitance 12.

Since the ninth transistor T3 is caused to conduct a current of Δl due to the above reason, the first parasitic capacitance 12 is discharged. Thus, the potential at the first node 20 is reduced.

On the other hand, only the current Δl of the current 10 flowing in the eighth transistor T2 flows in the second parasitic capacitance 14 without flowing in the tenth transistor T4 so that the second parasitic capacitance 14 is charged. Thus, the potential at the second node 22 is brought to a potential higher than the initial potential. Since the ninth and tenth transistors T3 and T4 are electrically cross-connected to each other, a large gain can be obtained. The following is considered as this reason.

The first and second parasitic capacitances 12 and 14 are discharged and charged owing to the difference between the currents which flow in the seventh and eighth transistors T1 and T2 respectively. At this time, the potential at the second node 22 is raised owing to the charging of the second parasitic capacitance 14. Therefore, the potential at the control electrode of the ninth transistor T3 is raised and an on resistance of the ninth transistor T3 is lowered. Further, an on resistance of the tenth transistor T4 increases owing to the same reason as described above. Accordingly, the potential at the second node 22 becomes higher than the initial potential. Similarly, the potential at the node 20 is further reduced. As a result, a high gain can be obtained.

Having now fully described the invention, it will be apparent to those skilled in the art that many changes and modifications can be made without departing from the spirit or scope of the invention as set forth herein.

INDUSTRIAL APPLICABILITY

A semiconductor memory device according to the present invention can obtain a high gain and provide low current consumption and high integration.

What is claimed is:

1. A semiconductor memory device comprising:
   first and second bit lines;
   a word line;
   a memory cell electrically connected to said first and second bit lines and said word line;
   a first current sense amplifier for reducing a potential level of a current flowing in said first and second bit lines and comprising first and second P-type transistors each having first and second main electrodes and a control electrode and third, fourth and fifth N-type transistors each having first and second main electrodes and a control electrode, said first main electrode of said first P-type transistor being connected electrically to said first bit line, said second main electrode of said first P-type transistor being connected to said second main electrode of said third N-type transistor through a first node and said control electrode of said first P-type transistor being connected to said second main electrode of said third N-type transistor through the first node and connected to said control electrode of said fourth N-type transistor, said first main electrode of said second P-type transistor being connected to said second bit line, said second main electrode of said second P-type transistor being connected to said second main electrode of said fourth N-type transistor through a second node and said control electrode of said second P-type transistor being connected to said second main electrode of said fourth N-type transistor through the second node and connected to said control electrode of said third N-type transistor, said first main electrodes of said third and fourth N-type transistors being connected to said second main electrode of said fifth N-type transistor, and said first main electrode of said fifth N-type transistor being connected to an earth; and
   a second sense amplifier electrically connected to an output of said first sense amplifier, for amplifying the amplitude of a potential applied between said first and second bit lines.

2. The semiconductor memory device according to claim 1, further comprising a first pull-up P-type transistor electrically connected to an input of said first bit line and a second pull-up P-type transistor electrically connected to an input of said second bit line.

3. A semiconductor memory device comprising:
first and second bit lines;
a word line;
a memory cell electrically connected to said first and second bit lines and said word line;
a first current sense amplifier for reducing a potential level of a current flowing in said first and second bit lines and comprising diode-connected first and second P-type transistors, third and fourth N-type transistors series-connected to said first and second P-type transistors respectively and a fifth N-type transistor connected to said third and fourth N-type transistors, said first P-type transistor having a control electrode electrically connected to a control electrode of said fourth N-type transistor and said second P-type transistor having a control electrode electrically connected to a control electrode of said third N-type transistor; and
a second sense amplifier electrically connected to an output of said first current sense amplifier, for amplifying the amplitude of a potential applied between said first and second bit lines.

4. The semiconductor memory device according to claim 3, further comprising a first pull-up P-type transistor electrically connected to an input of said first bit line and a second pull-up P-type transistor electrically connected to an input of said second bit line.

* * * * *